(12) United States Patent
Ono et al.

(10) Patent No.: US 9,508,914 B2
(45) Date of Patent: *Nov. 29, 2016

(54) MAGNETIC ANNEALING APPARATUS

(71) Applicant: Tokyo Electron Limited, Tokyo (JP)

(72) Inventors: Yuji Ono, Iwate (JP); Toru Ishii, Tokyo (JP); Makoto Saito, Iwate (JP); Mitsuru Obara, Iwate (JP); Yasushi Takeuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 177 days.

This patent is subject to a terminal disclaimer.

(21) Appl. No.: 14/211,619

(22) Filed: Mar. 14, 2014

(65) Prior Publication Data

US 2014/0287926 A1    Sep. 25, 2014

(30) Foreign Application Priority Data

Mar. 21, 2013  (JP) ................................ 2013-058325
Mar. 21, 2013  (JP) ................................ 2013-058326

(51) Int. Cl.
*F27D 3/12* (2006.01)
*H01L 39/02* (2006.01)
(Continued)

(52) U.S. Cl.
CPC ............... *H01L 39/02* (2013.01); *F27B 5/06* (2013.01); *F27B 5/12* (2013.01); *F27B 5/13* (2013.01); *F27D 3/0024* (2013.01); *F27D 3/0084* (2013.01); *F27D 11/12* (2013.01); *F27D 19/00* (2013.01); *H01L 43/12* (2013.01); *C21D 1/04* (2013.01); *C21D 2281/00* (2013.01);
(Continued)

(58) Field of Classification Search
CPC ....... C21D 1/04; C21D 2281/00; F27B 5/06; F27B 5/12; F27B 5/13; F27D 11/12; F27D 19/00; F27D 2003/0003; F27D 2003/0018; F27D 3/0024; F27D 3/0084; H01L 39/02; H01L 43/12
USPC ........ 266/103, 104; 219/601, 635, 653, 412, 219/390; 505/150, 500, 742
See application file for complete search history.

(56) References Cited

U.S. PATENT DOCUMENTS

| 6,303,908 B1 | 10/2001 | Yamaga et al. |
| 6,433,661 B1 | 8/2002 | Mita et al. |

(Continued)

FOREIGN PATENT DOCUMENTS

| JP | 04-114424 A | 4/1992 |
| JP | 2002-175998 A | 6/2002 |

(Continued)

*Primary Examiner* — Scott Kastler
*Assistant Examiner* — Michael Aboagye
(74) *Attorney, Agent, or Firm* — Abelman, Frayne & Schwab

(57) ABSTRACT

Disclosed is a magnetic annealing apparatus including a carrier conveyance region and a workpiece conveyance region. The carrier conveyance region includes: a first mounting table where a carrier is disposed; second mounting tables where carriers convey workpieces from the carrier conveyance region to the workpiece conveyance region; a storage unit; and a carrier conveyance mechanism that performs carrying-out/carrying-in of the carriers. The workpiece conveyance region includes: an aligner device; a workpiece boat; a workpiece conveyance mechanism that conveys the workpieces from the carriers disposed on the second mounting tables to the workpiece boat via the aligner device; a heating unit; a magnetic field generating unit; and a transfer mechanism that transfers the workpieces held by the workpiece boat into the magnetic field generating unit.

14 Claims, 6 Drawing Sheets

(51) Int. Cl.
*H01L 43/12* (2006.01)
*F27B 5/06* (2006.01)
*F27B 5/12* (2006.01)
*F27B 5/13* (2006.01)
*F27D 3/00* (2006.01)
*F27D 11/12* (2006.01)
*F27D 19/00* (2006.01)
*C21D 1/04* (2006.01)

(52) U.S. Cl.
CPC ................ *F27D2003/0003* (2013.01); *F27D 2003/0018* (2013.01)

(56) References Cited

U.S. PATENT DOCUMENTS

| | | | |
|---|---|---|---|
| 6,741,804 B2 | 5/2004 | Mack et al. | |
| 6,833,107 B2 | 12/2004 | Kuriyama et al. | |
| 7,161,124 B2 | 1/2007 | Kisner et al. | |
| 7,179,416 B2 * | 2/2007 | Ueno | F27B 14/08 219/390 |
| 7,264,768 B2 | 9/2007 | Tuttle et al. | |
| 2006/0082035 A1 | 4/2006 | Sugiyama et al. | |
| 2009/0209095 A1 * | 8/2009 | Horii | H01L 21/28035 438/585 |
| 2014/0284321 A1 * | 9/2014 | Ono | H01L 21/67754 219/601 |

FOREIGN PATENT DOCUMENTS

| | | |
|---|---|---|
| JP | 2004-263206 A | 9/2004 |
| JP | 2006-120861 A | 5/2006 |
| JP | 2009-152549 a | 7/2009 |
| WO | 2012-000663 A | 1/2012 |

* cited by examiner

MAGNETIC ANNEALING APPARATUS

CROSS-REFERENCE TO RELATED APPLICATIONS

This application is based on and claims priority from Japanese Patent Applications Nos. 2013-058325 and 2013-058326, filed on Mar. 21, 2013 with the Japan Patent Office, the disclosures of which are incorporated herein in their entireties by reference.

TECHNICAL FIELD

The present disclosure relates to a magnetic annealing apparatus.

BACKGROUND

A magnetic random access Memory (MRAM), which is one of non-volatile memories, recently attracts attention as a next generation semiconductor memory device. The MRAM is fabricated by performing a heat treatment (magnetic annealing) on a magnetic material film formed on a workpiece to be processed ("workpiece") which is, for example, a semiconductor wafer ("wafer") in a strong magnetic field to exhibit a magnetic property of the material film.

For example, Japanese Patent Laid-Open Publication No. 2004-263206 discloses a magnetic annealing apparatus which uses a solenoid type magnetic as a means for generating a magnetic field for performing a magnetic annealing processing and requires a relatively small installation area.

SUMMARY

According to an aspect of the present disclosure, there is provided a magnetic annealing apparatus including: a carrier conveyance region where one or more carriers that accommodate a group of workpieces to be processed are conveyed; a workpiece conveyance region where the workpieces are conveyed; an opening/closing door interposed between the carrier conveyance region and the workpiece conveyance region; and a control unit. The carrier conveyance region includes: a first mounting table on which a carrier to be carried into the magnetic annealing apparatus is disposed; a plurality of second mounting tables on which the carrier is disposed so as to convey the workpieces from the carrier conveyance region to the workpiece conveyance region through the opening/closing door in a hermetically sealed manner; a storage unit that stores a plurality of carriers; and a carrier conveyance mechanism configured to perform carrying-out/carrying-in of the carriers among the first mounting table, the second mounting tables, and the storage units. The workpiece conveyance region includes: an aligner device configured to align a plurality of workpieces; a workpiece boat configured to hold plural groups of workpieces; a workpiece conveyance mechanism configured to convey the workpieces among the carriers disposed on the second mounting tables, the aligner device, and the workpiece boat; a heating unit configured to heat the workpieces; a magnetic field generating unit including a horizontal superconducting magnet configured to apply magnetic fields to the workpieces; and a transfer mechanism configured to transfer the workpieces held by the workpiece boat into the magnetic field generating unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
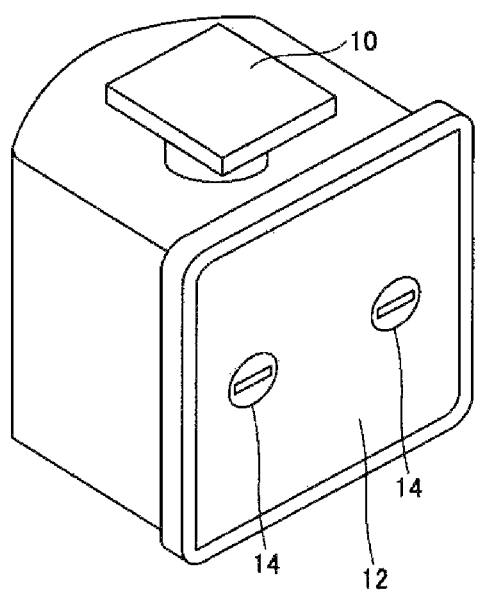
FIG. 1 is a schematic perspective view illustrating an example of a carrier of wafer carriers.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The magnetic annealing apparatus disclosed in Japanese Patent Laid-Open Publication No. 2004-263206 is a small-scale apparatus for use in research and development for an HDD (hard disk drive) or an MRAM. Considering MRAM market size expected in the forthcoming years, what is requested is to develop a magnetic annealing apparatus which may continuously or semi-continuously process a plurality (e.g., one hundred (100) sheets) of wafers.

In order to increase the number of wafers to be processed per unit time, it becomes necessary to configure the magnetic annealing device to be capable of not only processing a plurality of wafers collectively but also receiving wafers of the next batch within a short time.

In connection with the problems described above, the present disclosure is to provide a magnetic annealing apparatus capable of continuously processing a plurality of wafers.

In general, a superconducting magnet used in a semiconductor device magnetic annealing apparatus tend to become larger in weight and occupying area since a member configured to suppress leakage magnetic field is mounted thereon. Further, in a viewpoint of processing effect of the magnetic annealing processing, it may be considered to enlarge the superconducting magnet that performs the magnetic annealing processing in order to increase the number of wafers to be processed per unit time.

When the superconducting magnet is enlarged, it is desirable to arrange the superconducting magnet substantially transversely due to a limit on installation. However, when a large magnetic annealing apparatus is installed transversely, an axis of the superconducting magnet may not be horizontal in some cases. In particular, the magnetic annealing processing requires a very high alignment accuracy between a wafer surface and a magnetic force line. For this reason, when the axial direction of the solenoid type magnet is deviated from a horizontal level, it may be required to incline a transfer mechanism configured to transfer a wafer holing unit to the superconducting magnet, depending on the deviation.

However, when the transfer mechanism is inclined, the wafer holing unit is also inclined. As a result, conveyance may not be performed with a conventional wafer conveyance mechanism.

In connection with the problems described above, the present disclosure is to provide a magnetic annealing apparatus capable of efficiently carrying a wafer into a magnetic annealing apparatus.

According to a first aspect of the present disclosure, there is provided a magnetic annealing apparatus including: a carrier conveyance region where one or more carriers that accommodate a group of workpieces to be processed are conveyed; a workpiece conveyance region where the workpieces are conveyed; an opening/closing door interposed between the carrier conveyance region and the workpiece conveyance region; and a control unit. The carrier conveyance region includes: a first mounting table on which a carrier to be carried into the magnetic annealing apparatus is disposed; a plurality of second mounting tables on which the carrier is disposed so as to convey the workpieces from the carrier conveyance region to the workpiece conveyance region through the opening/closing door in a hermetically sealed manner; a storage unit that stores a plurality of carriers; and a carrier conveyance mechanism configured to perform carrying-out/carrying-in of the carriers among the first mounting table, the second mounting tables, and the storage units. The workpiece conveyance region includes: an aligner device configured to align a plurality of workpieces; a workpiece boat configured to hold plural groups of workpieces; a workpiece conveyance mechanism configured to convey the workpieces among the carriers disposed on the second mounting tables, the aligner device, and the workpiece boat; a heating unit configured to heat the workpieces; a magnetic field generating unit including a horizontal superconducting magnet configured to apply magnetic fields to the workpieces; and a transfer mechanism configured to transfer the workpieces held by the workpiece boat into the magnetic field generating unit.

In the magnetic annealing apparatus of the first aspect, the control unit performs a control such that, while the workpieces within the carrier disposed on one second mounding tables among the plurality of second mounting tables is conveyed to the workpieces holding unit, one of the carriers stored in the storage unit is conveyed to another mounting table among the plurality of second mounting tables.

In the magnetic annealing apparatus of the first aspect, the control unit controls the transfer mechanism to transfer the workpiece boat to the magnetic field generating unit after a predetermined number of groups of workpieces are held in the workpiece boat.

In the magnetic annealing apparatus of the first aspect, the control unit performs following controls. (i) The control unit controls the workpiece conveyance mechanism to convey the workpieces within the carrier disposed on one of the plurality of second mounting tables to the workpiece boat via the aligner device. (ii) During the conveyance at process (i), the control unit controls the carrier conveyance mechanism to carry out a carrier disposed on other mounting table among the plurality of second mounting tables from the other mounting table and conveys another carrier stored in the storage unit to the other mounting table. (iii) After the workpieces within the carrier disposed on the one mounting table are all conveyed to the workpiece boat, the control unit controls the workpiece conveyance mechanism to convey the workpieces within the carrier disposed on the other mounting table to the workpiece boat via the aligner device. (iv) During the conveyance at process (iii), the control unit controls the carrier conveyance mechanism to carry out the carrier disposed on the one mounting table from the one mounting table and convey another carrier stored in the storage unit to the one mounting table. In addition, (v) after the predetermined number of groups of workpieces are held in the workpiece boat by repeating processes (i) to (iv), the control unit controls the transfer mechanism to transfer the workpiece boat into the magnetic field generating unit.

In the magnetic annealing apparatus of the first aspect, the plurality of second mounting tables are two mounting tables, and the two mounting tables are arranged in series in a vertical direction.

In the magnetic annealing apparatus as described above, the workpieces are wafers and the one or more carriers are FOUPs. The FOUPs may accommodate 25 sheets of wafers, and the workpiece boat may hold 100 sheets of wafers.

According to a second aspect of the present disclosure, there is provided A magnetic annealing apparatus comprising: a horizontal superconducting magnet that constitutes a magnetic field generating unit configured to conduct a magnetic annealing processing on one or more workpieces; a workpiece boat configured to hold the workpieces; a workpiece conveyance mechanism configured to convey the workpieces between a carrier that accommodates the workpieces and the workpiece boat; and a transfer mechanism connected to the workpiece boat through a connection unit and configured to transfer the workpiece boat between a first position at a time of conveying the workpieces to the workpiece conveyance mechanism and a second position at a time of performing the magnetic annealing processing on the workpieces. The connection unit includes an angle adjusting mechanism configured to adjust an inclined angle of the workpiece boat.

In the magnetic annealing apparatus of the second aspect, at the first position, the angle adjusting mechanism adjusts the workpiece boat to be horizontal and, at the second position, the angle adjusting mechanism adjusts the workpiece boat such that an angle between an axis of the workpiece boat and magnetic force lines within the horizontal superconducting magnet becomes a predetermined angle.

In the magnetic annealing apparatus of the second aspect, at the second position, the angle adjusting mechanism adjusts the inclined angle such that the axis of the workpiece boat and the magnetic force lines within the horizontal superconducting magnet become parallel or perpendicular to each other.

The magnetic annealing apparatus of the second aspect may further include a push-up mechanism configured to push up a bottom surface of the workpiece boat under the bottom surface at the first position such that the axis of the workpiece boat becomes horizontal.

In the magnetic annealing apparatus of the second aspect, the workpieces are wafers and the carrier is a FOUP. The FOUP may accommodate 25 sheets of wafers, and the workpiece boat may hold 100 sheets of wafers.

In the magnetic annealing apparatus of the second aspect, the workpiece boat may hold 100 sheets of wafers at predetermined intervals in the direction of the axis as the loading direction.

In the magnetic annealing apparatus as described above, the workpiece boat may hold two loading bodies, each of which is loaded with 50 sheets of wafers at predetermined intervals using a direction perpendicular to the axis as a loading direction, to be parallel to each other in the direction of the axis.

According to a third aspect of the present disclosure, there is provided a magnetic annealing apparatus including: a carrier conveyance region where a carrier that accommodates one or more workpieces is conveyed; a workpiece conveyance region where the workpieces are conveyed; and an opening/closing door interposed between the carrier conveyance region and the workpiece conveyance region. The carrier conveyance region includes: a first mounting table on which a carrier carried into the magnetic annealing apparatus is disposed; a plurality of second mounting tables on which the carrier is mounted so as to convey the workpieces from the carrier conveyance region to the workpiece conveyance region through the opening/closing door in a hermetically sealed manner; a storage unit configured to store a plurality of carriers; and a carrier conveyance mechanism configured to perform carrying-out/carrying-in of the workpieces among the first mounting table, the second mounting tables, and the storage units. The workpiece conveyance region includes: an aligner device configured to align the workpieces; a workpiece boat configured to hold the workpieces; a workpiece conveyance mechanism configured to convey the workpieces among the carrier disposed on the second mounting table, the aligner device, and the workpiece boat; a heating unit configured to heat the workpieces; a magnetic field generating unit including a horizontal superconducting magnet configured to apply a magnetic field to the workpieces; and a transfer mechanism connected to the workpiece boat through a connection unit and configured to transfer the workpiece boat between a first position at a time of conveying the workpieces to the workpiece conveyance mechanism and a second position at a time of performing the magnetic annealing processing on the workpieces. The connection unit includes an angle adjusting mechanism configured to adjust an inclined angle of the workpiece boat.

According to the first aspect of the present disclosure, a magnetic annealing apparatus which is capable of continuously processing a plurality of wafers may be provided.

According to the second aspect of the second aspect, a magnetic annealing apparatus which is capable of efficiently carrying a wafer into the magnetic annealing apparatus may be provided.

Hereinafter, exemplary embodiments of the present disclosure will be described with reference to accompanying drawings.

(Carrier)

FIG. 1 is a schematic perspective view illustrating an example of a wafer carrier C. In the present exemplary embodiment, descriptions will be made on a case in which a front opening unified pod (FOUP) is used as a carrier C configured to accommodate a plurality of wafers W. However, the present disclosure is not limited thereto.

As illustrated in FIG. 1, one end of the carrier C of the wafers W is formed as an opening and the other end is formed, for example, in a substantially semi-elliptical shape.

On an inner wall of the carrier C, a support portion is formed so that the wafers W may be disposed in multiple stages. When peripheral edges of, for example, 300 mm wafers W, are disposed in the support portion, the wafers W may be accommodated in multiple stages with approximately even pitches. In general, one carrier C may accommodate 25 sheets of wafers.

On a ceiling portion of the carrier C, a handle 10 is provided to be gripped when holding the carrier C.

As illustrated in FIG. 1, an opening/closing lid 12 corresponding to the opening is detachably attached to the opening of the carrier C, and the inside of the carrier C is substantially hermetically sealed by the opening/closing lid 12. In general, the inner atmosphere of the carrier is formed of a clean gas (e.g., clean air).

The opening/closing lid 12 is provided with, for example, two locking mechanisms 14 and when the locking mechanism 14 is locked or unlocked, the opening/closing lid 12 may be attached to or detached from the opening.

A plurality of positioning recesses (not illustrated) are formed on the bottom surface of the bottom wall of the carrier C such that the carrier C may be positioned when placed on a mounting table to be described later. A lock member (not illustrated) is provided on the bottom surface of the bottom wall of the carrier so that the carrier C may be locked when placed on the mounting table.

(Magnetic Annealing Apparatus)

Figure 2:
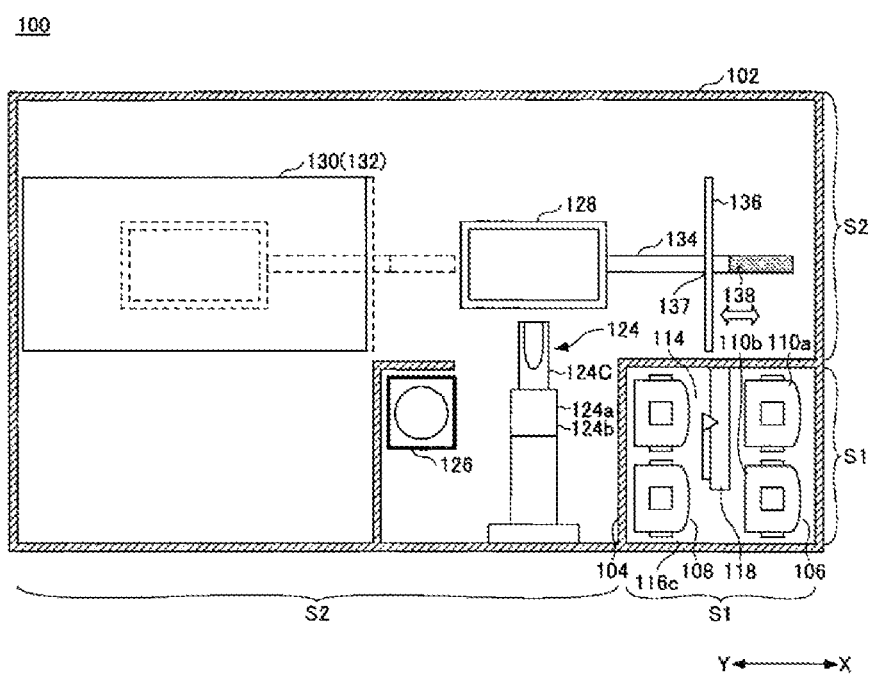
FIG. 2 is a schematic horizontal cross-sectional view illustrating an example of a magnetic annealing apparatus.

Next, descriptions will be made on an exemplary embodiment of the magnetic annealing apparatus. FIG. 2 is a schematic horizontal cross-sectional view illustrating an example of the magnetic annealing apparatus. Meanwhile, with respect to a wafer boat 128, a heat insulation portion 134, a cap 136, an angle adjusting mechanism 137, and a transfer mechanism 138 which will be described later, the solid lines indicate a position at a time of conveying the wafers W to the wafer boat 128, and the dotted lines indicate a position at a time of performing the magnetic annealing processing on the wafers W.

As illustrated in FIG. 2, the magnetic annealing apparatus 100 is configured to be accommodated in a case 102. The case 102 forms the exterior body of the magnetic annealing apparatus and a carrier conveyance region S1 and a wafer conveyance region S2 are formed within the case 102.

The carrier conveyance region S1 is a region in which the carrier C, in which the wafers W are accommodated as the workpieces, is carried into or carried out of the magnetic annealing apparatus. In addition, the wafer conveyance region S2 is a transfer region in which the wafers W in the carrier C are conveyed and carried into a magnetic annealing furnace to be described later.

The carrier conveyance region S1 and the wafer conveyance region S2 are partitioned by a partition wall 104.

The carrier conveyance region S1 is placed under an air atmosphere and the wafers W accommodated in the carrier C are conveyed in the carrier conveyance region S1. A region between respective processing apparatuses corresponding to the carrier conveyance region S1 and, in the present exemplary embodiment, a space within a clean room outside of the magnetic annealing apparatus 100 corresponding to the carrier conveyance region S1.

Meanwhile, although not particularly limited, the atmosphere of the wafer conveyance region S2 may be an air atmosphere or an inert gas atmosphere such as, for example a nitrogen ($N_2$) atmosphere. When a processing is required to be performed under a lower oxygen atmosphere due to a configuration of a workpiece, for example, when it is desired to prevent formation of, for example, an oxide film, the inert gas atmosphere may be employed. In addition, the wafer conveyance region S2 is generally maintained a higher level of cleanness and a lower oxygen concentration as compared to the carrier conveyance region S1.

In the descriptions set forth below, the left-right direction of FIG. 2 is assumed to be a front-rear direction of the magnetic annealing apparatus. Meanwhile, the carrier conveyance region S1 side is assumed to be the front side (X-direction in FIG. 2), and the wafer conveyance region S2 side is as assumed to be the rear side (Y-direction in FIG. 2).

[Carrier Conveyance Region S1]

Figure 3:
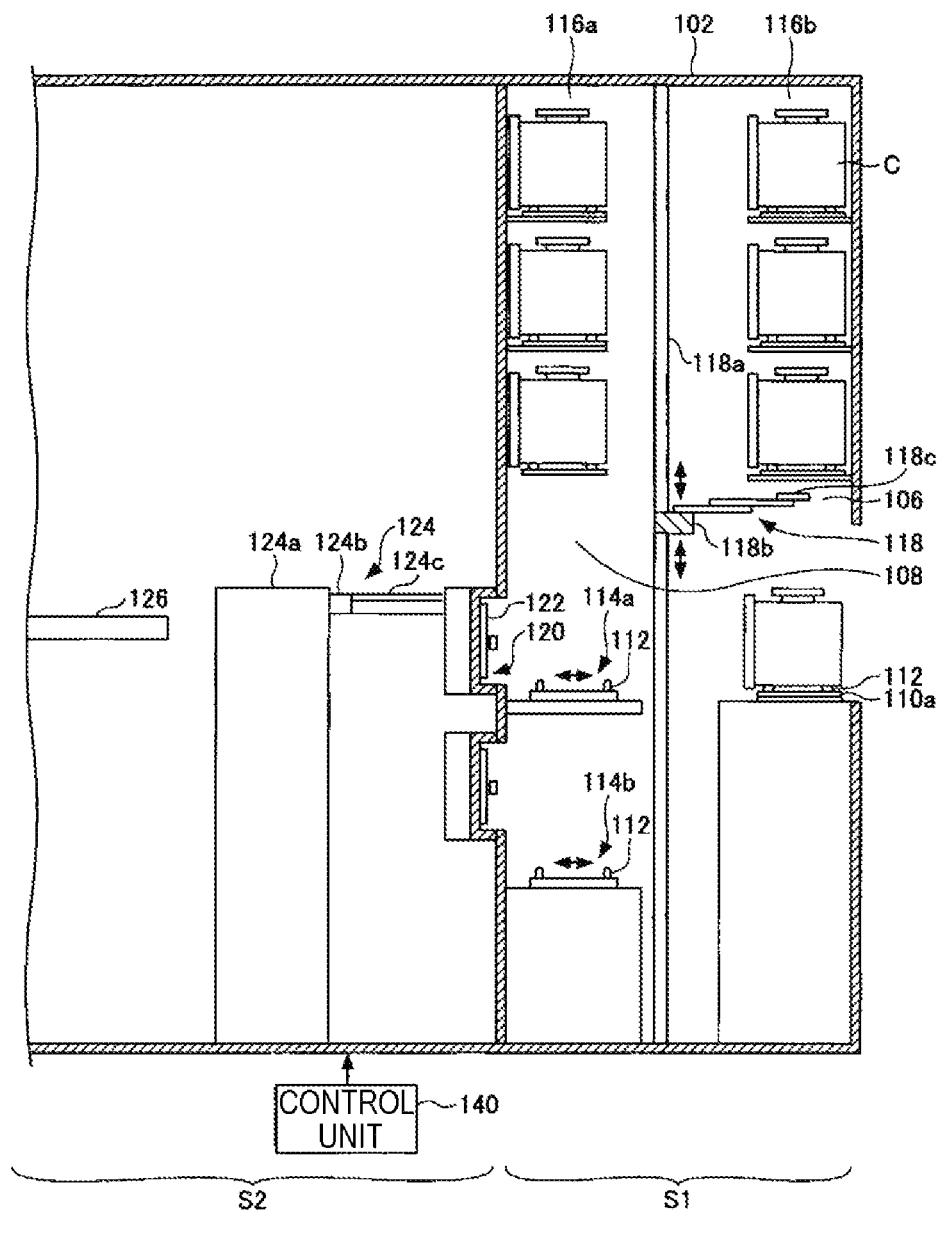
FIG. 3 is a schematic vertical cross-sectional view illustrating a vicinity of a carrier conveyance region of the magnetic annealing apparatus.

The carrier conveyance region S1 will be described in more detail. FIG. 3 illustrates a schematic vertical cross-sectional view of a portion in the vicinity of the carrier conveyance region of the magnetic annealing apparatus.

The carrier conveyance region S1 includes a first conveyance region 106 and a second conveyance region 108 positioned at the rear side of the first conveyance region 106.

As illustrated in FIG. 2, two first mounting tables 110a, 110b, on each of which a carrier C is placed, are provided in the left-right direction of the first conveyance region 106 (a direction perpendicular to the X-Y direction of FIG. 2). On the mounting surface of each of the first mounting tables 110a, 110b, pins 112 configured to correspond to the positioning recesses of the carrier C and perform the positioning of the carrier C are provided at, for example, three locations, respectively.

In the second conveyance region 108, two second mounting tables 114a, 114b are provided in which the two second mounting tables 114a, 114b are arranged to be parallel to any one of the left and right first mounting tables (in the present exemplary embodiment, the mounting table 110a) in the front-rear direction and disposed in series in the vertical direction of FIG. 3. Each of the second mounting tables 114a, 114b is configured to be movable in the front-rear direction.

On the mounting surface of the second mounting table 114a or 114b, pins 112 configured to position the carrier C are also provided at, for example, three positions as in the first mounting table 110a or 110b. In addition, a hook configured to fix the carrier C is provided on the mounting surface.

As illustrated in FIG. 3, first carrier storage units 116a, 116b configured to store carriers C are formed at the upper side of the second conveyance region 108 and/or the first conveyance region 106. Each of the carrier storage units 116a, 116b is configured by, for example, two or more stages of shelves, and, for example, two carriers may be arranged on each shelf in the left-right direction.

In addition, as illustrated in FIG. 2, a second carrier storage unit 116c configured by a plurality of shelves are formed in the left-right direction of the second mounting tables 114a, 114b.

Since the first carrier storage units 116a, 116b and the second carrier storage units 116c are provided, a sufficient number of carriers (i.e., a sufficient number of wafers W) may be kept in carrier conveyance region S1. For this reason, even if, for example, 100 sheets of wafers are transferred by a wafer transfer method to be described later, the shortage of carriers C will not occur when the carriers C are stored in the carrier storage units 116a, 116b, 116c.

The second conveyance region 108 is provided with a carrier conveyance mechanism 118 configured to convey the carriers C between the first and second mounting tables 110a, 110b; 114a, 114b and the first and second carrier storage units 116a; 116b, 116c. The carrier conveyance mechanism 118 includes a guide unit 118a configured to be movable up and down in the vertical direction, a moving unit 118b configured to move up and down while being guided by the guide unit 118a, and a conveyance arm 118c installed on the moving unit to support the bottom of the moving unit 118b and convey the moving unit 118b in the horizontal direction.

The partition wall 104 is formed with a conveyance port 120 of wafers W to allow the carrier conveyance region S1 and the wafer conveyance region S2 to communicate with each other. The conveyance port 120 is provided with an opening/closing door 122 which is configured to block the conveyance port 120 at the wafer conveyance region S2 side. A driving mechanism (not illustrated) is connected to the opening/closing door 122. By the driving mechanism, the opening/closing door 122 is configured to be movable forward, rearward, upward and downward so as to open/close the conveyance port 120.

<Conveyance of Carrier C (Wafer W) in Carrier Conveyance Region S1>

Descriptions will be made on the conveyance of wafers W from the carrier conveyance region S1 to the wafer conveyance region S2. First, a carrier C is moved by the above-described conveyance 118c from first mounting table 110a or 110b, the first carrier storage unit 116a or 116b or the carrier storage unit 116c to the mounting table 114a or 110b. The carrier C is placed such that the positioning recesses thereof and the pins 112 are engaged with each other. When the carrier C is placed on the second mounting table 114, the second mounting table 114 is moved to the partition wall 104 side and the carrier C comes in contact with the partition wall 104. The contact state of the carrier C is maintained by a fixing mechanism (not illustrated).

Then, in a state where the opening/closing door 122 formed on the partition wall 104 and the opening/closing lid 12 of the carrier C are sealed, the opening/closing lid 12 is opened by an opening/closing mechanism (not illustrated). When the atmosphere of the wafer conveyance region S2 is formed as an inert gas atmosphere, first, inert gas replacement is performed by an inert gas replacement means (not illustrated) in the state where the opening/closing lid 12 of the carrier C is sealed and air is removed from the space between the opening/closing door 122 and the opening/closing lid 12 such that the space is filled with the inert gas. Subsequently, the inert gas replacement is performed inside the carrier C by the inert gas replacement means.

Then, the opening/closing door 122 formed on the partition wall 104 of the magnetic annealing apparatus 100 is opened and the wafers W in the carrier C are carried into/carried out by a wafer conveyance mechanism 124 to be described later.

At the time of replacement of carriers C and carrying-out of wafers W, the reversed operations of the above-described operations are performed.

[Wafer Conveyance Region S2]

Figure 4:
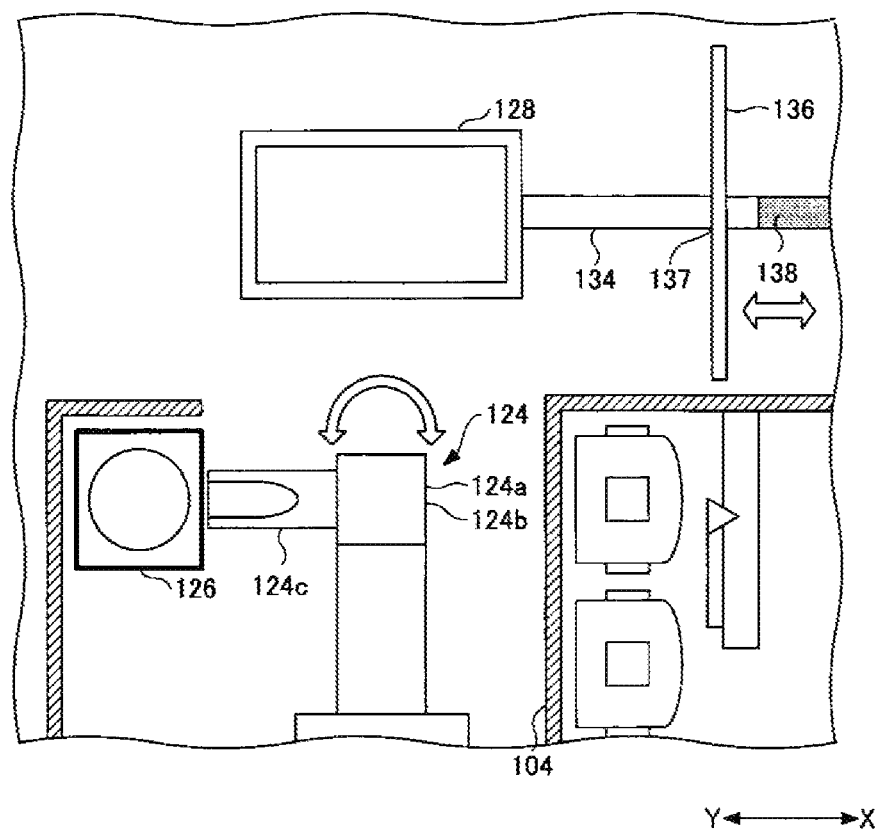
FIG. 4 is a schematic horizontal cross-sectional view illustrating a vicinity of a wafer conveyance region magnetic annealing apparatus.

FIG. 4 is a horizontal cross-sectional view illustrating an area in the vicinity of the wafer conveyance region S2 of the magnetic annealing apparatus 100. As illustrated in FIG. 4, in the wafer conveyance region S2 , a wafer conveyance mechanism 124, an aligner device 126, a wafer boat 128, and a magnetic field generating unit 130 (see, e.g., FIG. 2) are mainly installed.

The wafer conveyance mechanism 124 serves to convey the wafers W in the wafer conveyance region S2and is installed between the wafer boat 128 and the conveyance port 120 of the partition wall 104. The wafer conveyance mechanism 124 includes a moving body 124b that moves along a vertically extending guide mechanism 124a and rotates around the vertical axis, and, for example, five (5) reciprocating arm units 124c installed on a moving body 124b. The wafer conveyance mechanism 124 conveys wafers among the wafer boat 128, the carrier C on the second mounting table 114 or 114b, and the aligner device 126.

The aligner device 126 is adapted to grip, for example, edges of wafers W to perform centering and angular alignment of, for examples, notches.

The wafer boat 128 generally has a cylindrical shape and may hold a plurality of wafers C within a plurality carriers C, for example, four (4) carriers C. In addition, the wafer boat 128 is disposed at the rear side of the cap 136 through the heat insulation portion 134. The cap 136 is supported at the rear side of the transfer mechanism 138, and the wafer boat 128 is conveyed into or conveyed out from the magnetic field generating unit 130 by the transfer mechanism 138.

In general, the cap 136 and the heat insulation portion 134 are configured to be fixed to each other such that the main surface of the cap 136 and the axial direction of the heat insulation portion 134 are perpendicular to each other. In addition, the axial direction of the heat insulation portion 134 and the axial direction of the wafer boat 128 are fixed to be parallel to each other.

In the magnetic annealing apparatus 100 of the present exemplary embodiment, at least one of the cap 136 and the heat insulation portion 134 is provided with an angle adjusting mechanism 137 such that the angle between the main surface of the cap 136 and the axial direction of the heat insulation portion 134 is variable. That is, the inclined angle of the wafer boat 128 may be changed by providing the angle adjusting mechanism 137.

The angle adjusting mechanism 137 is configured to determine whether the axis of the wafer boat 128 is horizontal or not preferably using a level gauge and, when the axis of the wafer boat 128 is not horizontal, to change the inclined angle of the wafer boat 128 through the heat insulation portion 134 so as to maintain the axis, for example, horizontally.

As illustrated in FIG. 6 to be described later, the transfer mechanism 138 is provided with a connection unit 138a connected to the cap 136, a guide rail 138b formed in the above-mentioned front-rear direction and connected to the connection unit 138a to guide transfer mechanism 138, and a driving mechanism (not illustrated). Thus, the transfer mechanism 138 is configured to be slidable on the guide rail 138.

In addition, each of the cap 136, the connection unit 138a, and the guide rail 138b is formed as a rigid body and configured such that a relative angle therebetween may be constantly maintained.

At the rear side of the wafer boat 128, a magnetic field generating unit 130 configured to perform a magnetic annealing processing on the wafers W is disposed. As for the magnetic field generating unit, a magnetic annealing furnace may be used. The magnetic annealing furnace has a right end as an inlet of the furnace and which is made of a horizontal solenoid type magnet (superconducting magnet). The solenoid type magnet is disposed such that the axial direction of the magnet is substantially horizontal, and is connected to a power source device (not illustrated). The direction of magnetic fields generated by the horizontal solenoid type magnet (direction of the magnetic force lines) will be the above-mentioned front-rear direction.

In addition, a heating unit 132 is disposed along the inner periphery of the magnetic field generating unit 130 to heat the wafers W to a predetermined temperature. That is, the wafer W is heated under uniform magnetic fields by the magnetic field generating unit 130.

When the same magnetic annealing processing is performed on a plurality (e.g., 100 sheets) of wafers, it is required to arrange the wafers in the even magnetic field region in order to perform a uniform processing on all the wafers W. The even magnetic field region of the solenoid type magnet is about 20% of the axial length of the solenoid type magnet. For this reason, when, for example, 100 sheets of wafers with a diameter of ϕ300 mm are processed by the magnetic annealing apparatus, the horizontal solenoid type magnet may be designed to have an inner diameter (bore diameter) of ϕ570 mm, an outer diameter of ϕ1900 mm, and a length of 2500 mm (here, the length of the even magnetic field region is about 680 mm).

In addition, the weight of the horizontal solenoid type magnet as designed above is about 25 tons. For this reason, on the bottom of the solenoid type magnet, a holing base (not illustrated) and a holding plate (not illustrated) on the bottom of the holding base are provided so as to hold the solenoid type magnet.

As illustrated in FIG. 3, the magnetic annealing apparatus 100 is equipped with a control unit 140 which may be configured by, for example, a computer. The control unit 140 includes, for example, a program, a memory, and a data processing unit configured by a CPU. In the program, commands (respective steps) are incorporated so that control signals are sent from the control unit to the respective components of the magnetic annealing apparatus so as to progress respective processings. By the control signals, the conveyance of carriers C, the control of the inclined angle of the wafer boat 128 by the angle adjusting mechanism 137, the conveyance of wafers W, the opening/closing of the opening/closing door, the opening/closing of the lid, and the processings are performed. The program may be stored in a computer storage medium such as, for example, a flexible disc, a compact disc, a hard disc, a magneto optical (MO) disc, or a memory card, and installed in the control unit.

<Conveyance of Wafer W in Wafer Conveyance Region S2>

As described above, the magnetic annealing apparatus of the present exemplary embodiment is configured such that the inclined angle of the wafer boat 128 can be adjusted by adjusting the angle between the cap 136 and the heat insulation portion 134 by the angle adjusting mechanism 137. As a result, when the wafers W are conveyed to the wafer boat 128, and when the wafers W accommodated in the wafer boat 128 are loaded in the magnetic field generating unit 130, the angle between the cap 136 and the heat insulation portion 134 can be independently adjusted optimally.

Effects of the angle adjusting mechanism 137 will be described with reference to a specific exemplary embodiment.

Descriptions will be made on a series of flows until the wafers W mounted on the second mounting tables 114a, 114b are conveyed to the wafer boat 128 from the carrier C.

First, the wafers W carried into the wafer conveyance region S2 are transferred to the aligner device 126 by the wafer conveyance mechanism 124, and centering and angular alignment of, for example, notches, are performed. Substantially, after being subjected to the angular alignment, the wafers W are transferred from the aligner device 126 to the wafer boat 128 by the wafer conveyance mechanism 124. After the transfer of the wafers W to the wafer boat 128 is terminated, the wafer conveyance mechanism 124 returns to the carrier C, and the next wafers are transferred.

Meanwhile, as described below, it is desirable that the conveyance of the wafers W to the wafer boat 128 by the wafer conveyance mechanism 124 is performed while the wafer boat 128 is in the horizontal state.

The number of wafers W held in one carrier C is generally 25 sheets and the number of wafers W conveyed by the wafer conveyance mechanism 124 is generally 5 sheets. Thus, for one carrier C, the transfer of wafers W from the carrier C to the wafer boat 128 via the aligner device 126 is performed five times. After the transfer of the wafers W from the carrier C mounted on one of the second mounting tables (e.g., the second mounting table 114*a*) is terminated, the transfer of the wafers W of the carrier C mounted on the other second mounting table (e.g., the second mounting table 114*b*) is performed by the wafer conveyance mechanism 124. At this time, the empty carrier C mounted on the second mounting table 114*a* is replaced by another carrier C stored in the carrier storage unit 116 while the transfer of the wafers W from the carrier C mounted on the other second mounting table 114*b* is performed.

Figure 5A:
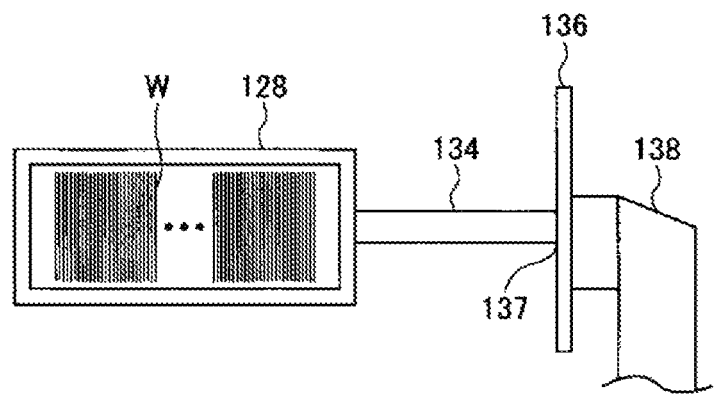
FIGS. 5A and 5B are schematic views for describing arrangement examples of wafers held in a wafer boat.
Figure 5B:
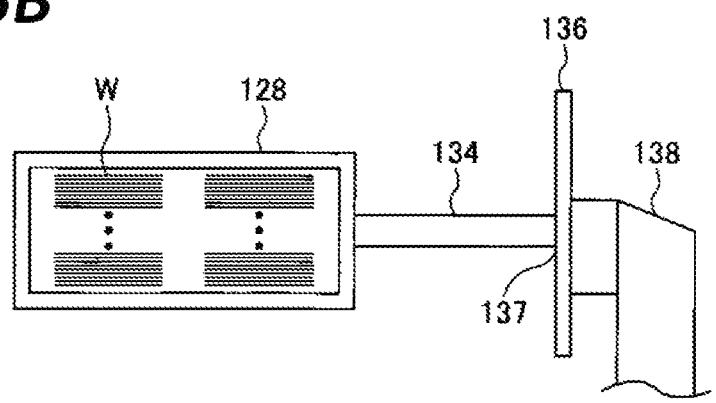

FIGS. 5A and 5B illustrate a schematic view for describing an example of arranging the wafers W held in the wafer boat 128.

FIG. 5A illustrates an arrangement example in which the arranging direction of the wafers W is the above-described left-right direction, and FIG. 5B illustrates an arrangement example in which the arranging direction of the wafers W is the vertical direction.

As the magnetic annealing processings of wafers W, there are known two methods, i.e. a perpendicular magnetization method in which magnetic fields are applied in a direction perpendicular to the main surfaces of the wafers W, and an in-plane magnetization method in which the magnetic fields are applied in a direction parallel to the main surfaces of the wafers W. When a horizontal solenoid-type magnet is employed as the magnetic field generating unit 130 as in the present exemplary embodiment, the direction of the magnetic fields (magnetic force lines) in the magnet will be the above-mentioned front-rear direction.

As a more specific example, descriptions will be made on an example of conveying 100 sheets of wafers to the wafer boat 128. However, the present disclosure is not limited thereto. When a magnetic annealing processing is performed on the wafers W in the perpendicular magnetization method, the wafers W are arranged such that the loading direction thereof becomes the above-mentioned front-rear direction as illustrated in FIG. 5A. For example, when 100 sheets of wafers W are processed, one loading body, in which 100 sheets of wafers W are loaded at predetermined intervals like a shelf as illustrated in FIG. 5A, is disposed in the wafer boat 128. Meanwhile, when the magnetic annealing processing is performed by the in-plane magnetization method, two loading bodies, in each of which 50 sheets of wafers are loaded at predetermined intervals as illustrated in FIG. 5B, may be disposed in the wafer boat 128 to be aligned in parallel to each other in the above-mentioned left-right direction.

Figure 6A:
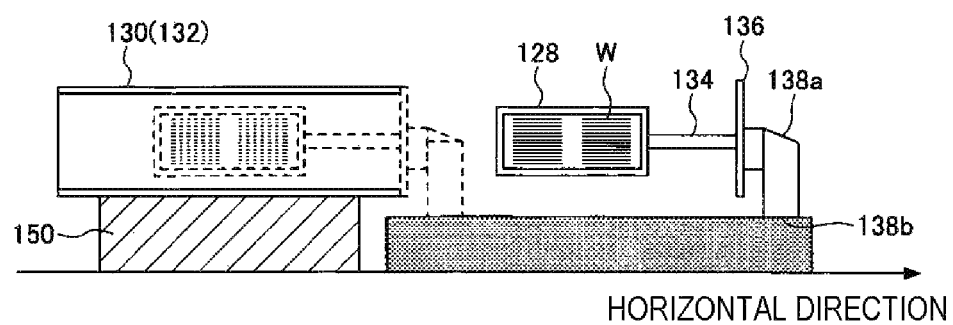
FIGS. 6A and 6B are schematic views for describing carrying-in or carrying-out of a wafer boat with respect to a magnetic field generating unit.
Figure 6B:
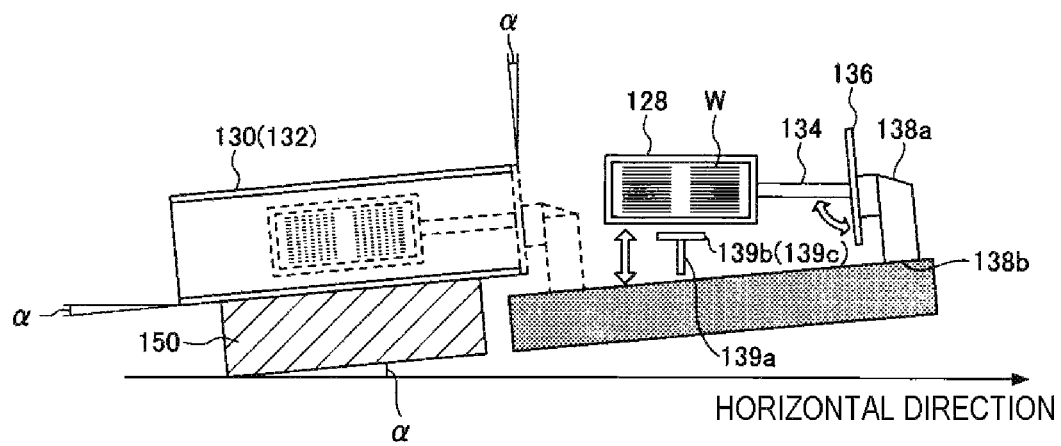

FIGS. 6A and 6B illustrate a schematic view for describing carrying-in or carrying-out of the wafer boat 128 with respect to the magnetic field generating unit 130. Referring to FIGS. 6A and 6B, descriptions will be made on a case where two loading bodies, in each of which 50 sheets of wafers W are loaded at predetermined intervals in the vertical direction, are disposed in the wafer boat 128 to be aligned in parallel to each other in the above-mentioned left-right direction. However, the present disclosure is not limited thereto.

More specifically, FIG. 6A is a schematic view illustrating a case in which the magnetic field generating unit 130 is disposed in the horizontal direction, and FIG. 6B is a schematic view illustrating a case in which the magnetic field generating unit 130 is disposed at an angle α (α>0) with respect to the horizontal direction. Meanwhile, in FIGS. 6A and 6B, the disposed positions of the wafer boat 128, the heat insulation portion 134, and the cap 136 at a time of conveying the wafers W to the wafer boat 128 are depicted by solid lines, and the disposed positions thereof at a time of conveying the wafers W are conveyed to the magnetic field generating unit 130 are depicted by dotted lines.

As illustrated in FIG. 6A, when the installed magnetic field generating unit 130 is horizontal, the guide rail 138*b* of the transfer mechanism 138 also becomes horizontal. In such a case, the direction of magnetic force lines in the coil-type magnetic field generating unit 130 also becomes horizontal.

Meanwhile, the plane direction of the main surface of the cap 136 becomes horizontal, and the axial direction of the heat insulation portion 134 and the axial direction of the wafer boat 128 become substantially horizontal. Thus, the wafers W may be stably conveyed to the wafer boat 128 without making the axis of the wafer boat 128 inclined.

In general, a wafer holing unit (not illustrated) in the wafer boat 128 is formed with a sufficient clearance in order to ensure that the wafers W may be conveyed by the wafer conveyance mechanism 124 even when the wafer boat 128 is not horizontal. However, in a case where the magnetic annealing apparatus is capable of processing for example, 100 sheets of ϕ300 mm wafers at once as in the present exemplary embodiment, the axial length of the coil-type magnetic field generating unit 130 is increased. Since the uniform magnetic field region is about 20% of the axial direction of the magnetic field generating unit 130 as described above, the axial length of the heat insulation portion 134 to be required is also increased. In such a case, the insulation portion 134 may be flexed due to the weight of the wafer boat 128 (and the wafers W accommodated therein). Due to the flexing or the like, the axis of the wafer boat 128 may be inclined, and when the inclined extent is larger than the above-mentioned clearance, the wafers W may not be conveyed to the wafer boat 128 by the wafer conveyance mechanism 124.

However, magnetic annealing apparatus 100 of the present exemplary embodiment is provided with an angle adjusting mechanism 137 configured to adjust the inclined angle of the wafer boat 128. For this reason, the conveyance of the wafers W to the wafer boat 128 may be performed in a state where the angle between the cap 136 and the heat insulation portion 134 is adjusted by the angle adjusting mechanism 137 to make the axis of the wafer boat 128 horizontal.

Meanwhile, after the wafers W are conveyed to the wafer boat 128, the heat insulation portion 134 may also be flexed depending on the number of conveyed wafers W. When the heat insulation portion 134 is flexed, the axis of the wafer boat 128 is inclined from the horizontal level. Thus, the angle between the direction of the magnetic force lines and the wafer surfaces may be deviated from a desired angle. In such a case, it may be impossible to perform a desired magnetic annealing processing on the wafers W. In addition, according to the recent enlargement of wafers W, when the axis of the wafer boat 128 is inclined from the horizontal level, the wafers W may be flexed therein due to the weight thereof while the wafers W are being subjected to the magnetic annealing processing, and a slip dislocation may occur due to stress concentration.

However, the magnetic annealing apparatus 100 of the present exemplary embodiment is provided with the angle adjusting mechanism 137 configured to adjust the inclined angle of the wafer boat 128. For this reason, the axis of the wafer boat 128 (i.e., the wafer surfaces) and the magnetic force lines may form a desired angle therebetween by changing the angle between the cap 136 and the heat insulation portion 134 to adjust the inclined angle of the wafer boat 128.

In addition, the wafer boat 128 is loaded in the magnetic field generating unit 130 by the transfer mechanism 138.

Meanwhile, the adjustment of the angle between the cap 136 and the heat insulation portion 134 by the angle adjusting mechanism 137 may be performed even after the wafer boat 128 is loaded in the magnetic field generating unit 130.

Meanwhile, as illustrated in FIG. 6B, in a case where the magnetic field generating unit 130 is installed to be inclined, for example, at an angle α, from the horizontal level, the guide rail 138b of the transfer mechanism 138 is also installed to be inclined at the angle α from the horizontal level. In such a case, the direction of the magnetic force lines in the coil-type magnetic field generating unit 130 is inclined at the angle α from the horizontal direction.

In addition, the plane direction of the main surface of the cap 136 is inclined at the angle α, and the axial direction of the heat insulation portion 134 and the axis of the wafer boat 128 are inclined at the angle α from the horizontal level.

As described above, it is desirable that the wafer boat 128 is horizontal while the wafers W are conveyed to the wafer boat 128. For this reason, when the wafers W are conveyed to the wafer boat 128, the angle between the cap 136 and the heat insulation portion 134 is changed by the angle adjusting mechanism 137 so as to make the axes of the heat insulation portion 134 and the wafer boat 128 horizontal.

After the wafers W are conveyed to the wafer boat 128, the heat insulation portion 134 may be flexed depending on the number of conveyed wafers W. For this reason, when the wafer boat 128 is loaded in the magnetic field generating unit 130, considering such flexure, the angle between the direction of the magnetic force lines in the coil-type magnetic field generating unit 130 and the wafer surfaces is adjusted to be a desired angle by the angle adjusting mechanism 137. In addition, in this state, the wafer boat 128 is loaded in the magnetic field generating unit 130 by the transfer mechanism 138.

That is, since the magnetic annealing apparatus 100 of the present exemplary embodiment is provided with the angle adjusting mechanism 137, the inclined angle of the wafer boat 128 (the horizontal level of the axis of the wafer boat 128) may be independently adjusted when the wafers W are conveyed to the wafer boat 128 by the wafer conveyance mechanism 124 and when the wafers W conveyed to the wafer boat 128 are conveyed to the magnetic field generating unit 130. As a result, it is possible to provide a magnetic annealing apparatus capable of carrying wafers into the magnetic annealing apparatus in an efficient and high precise manner.

In addition, the magnetic annealing apparatus 100 of the present exemplary embodiment may be provided with a push-up mechanism 139 which is installed at the bottom side of the wafer boat 128 and configured to push up the wafer boat 128 as illustrated in FIG. 6B.

The push-up mechanism 139 is formed by a liftable guide unit 139a, a moving unit 139b configured to be moved up and down while being guided by the guide unit 139a, and a push-up member 139c configured to come in contact with the bottom surface of the wafer boat 128 when pushed up.

By providing the push-up mechanism 139, it is more securely ensured that the axis of the wafer boat 128 can be maintained horizontally while the wafers W are conveyed to the wafer boat 128. Therefore, the wafers W can be stably conveyed to the wafer boat 128.

After the wafer boat 128 is loaded in the magnetic field generating unit 130 by the transfer mechanism 138, a predetermined magnetic annealing processing is performed on the wafers W. The carrying-out of the wafers after termination of the processing is conducted by unloading the wafer boat 128 from the magnetic field generating unit 130 first and transferring the wafers W from the opening/closing window positioned at the second mounting table 114a or 114b to the carrier C in the sequence opposite to that in the carry-in described above using the wafer conveyance mechanism 124. In such a case, the wafer boat 128 is adjusted by the angle adjusting mechanism 137 such that the bottom surface thereof becomes horizontal. After the wafers W are conveyed to the carrier C by the wafer conveyance mechanism 124, the opening/closing lid is attached to the carrier C by an opening/closing mechanism (not illustrated) and the carrier C is carried out by the carrier conveyance mechanism 118 to proceed to the next process.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A magnetic annealing apparatus comprising:
a carrier conveyance region where one or more carriers that accommodate a group of workpieces to be processed are conveyed;
a workpiece conveyance region where the workpieces are conveyed;
an opening/closing door interposed between the carrier conveyance region and the workpiece conveyance region; and
a control unit,
wherein the carrier conveyance region includes:
a first mounting table on which a carrier to be carried into the magnetic annealing apparatus is disposed;
a plurality of second mounting tables on which the carrier is disposed so as to convey the workpieces from the carrier conveyance region to the workpiece conveyance region through the opening/closing door in a hermetically sealed manner;
a storage unit that stores a plurality of carriers; and
a carrier conveyance mechanism configured to perform carrying-out/carrying-in of the carriers among the first mounting table, the second mounting tables, and the storage units, and
wherein the workpiece conveyance region includes:
an aligner device configured to align a plurality of workpieces;
a workpiece boat disposed at a rear side of a cap through a heat insulation portion and configured to hold plural groups of workpieces;
a workpiece conveyance mechanism configured to convey the workpieces among the carriers disposed on the second mounting tables, the aligner device, and the workpiece boat;
a heating unit configured to heat the workpieces;
a magnetic field generating unit including a horizontal superconducting magnet configured to apply magnetic fields to the workpieces; and a transfer mechanism configured to transfer the workpieces held by the workpiece boat into the magnetic field generating unit, wherein at least one of the cap and the heat insulation portion is provided with an angle adjusting mechanism configured to adjust an angle between a main surface of the cap and a longitudinal axis direction of the heat insulation portion in order to adjust an inclined angle of the workpiece boat, one end of the heat insulation portion being connected to the main surface of the cap and the other end of the heat insulation portion being connected to workpiece boat.

2. The magnetic annealing apparatus of claim 1, wherein the control unit performs a control such that, while the workpieces within the carrier disposed on one second mounding tables among the plurality of second mounting tables is conveyed to the workpieces holding unit, another carrier stored in the storage unit is conveyed to other mounting table among the plurality of second mounting tables.

3. The magnetic annealing apparatus of claim 1, wherein the control unit controls the transfer mechanism to transfer the workpiece boat to the magnetic field generating unit after a predetermined number of groups of workpieces are held in the workpiece boat.

4. The magnetic annealing apparatus of claim 1, wherein
(i) the control unit controls the workpiece conveyance mechanism to convey the workpieces within the carrier disposed on one of the plurality of second mounting tables to the workpiece boat via the aligner device,
(ii) during the conveyance at process (i), the control unit controls the carrier conveyance mechanism to carry out a carrier disposed on other mounting table among the plurality of second mounting tables from the another mounting table and conveys another carrier stored in the storage unit to the other mounting table,
(iii) after the workpieces within the carrier disposed on the one mounting table are all conveyed to the workpiece boat, the control unit controls the workpiece conveyance mechanism to convey the workpieces within the carrier disposed on the other mounting table to the workpiece boat via the aligner device,
(iv) during the conveyance at process (iii), the control unit controls the carrier conveyance mechanism to carry out the carrier disposed on the one mounting table from the one mounting table and convey another carrier stored in the storage unit to the one mounting table, and
(v) after a predetermined number of groups of workpieces are held in the workpiece boat by repeating processes (i) to (iv), the control unit controls the transfer mechanism to transfer the workpiece boat into the magnetic field generating unit.

5. The magnetic annealing apparatus of claim 1, wherein the plurality of second mounting tables are two mounting tables, and the two mounting tables are arranged in series in a vertical direction.

6. The magnetic annealing apparatus of claim 1, wherein the workpieces are wafers and the one or more carriers are FOUPs, and
wherein the FOUPs is configured to each accommodate 25 sheets of wafers, and the workpiece boat is configured to hold 100 sheets of wafers.

7. A magnetic annealing apparatus comprising:
a magnetic field generating unit configured to conduct a magnetic annealing processing on one or more workpieces to be processed;
a workpiece boat disposed at a rear side of a cap through a heat insulation portion and configured to hold the workpieces;
a workpiece conveyance mechanism configured to convey the workpieces between a carrier that accommodates the workpieces and the workpiece boat; and
a transfer mechanism connected to the workpiece boat through a connection unit and configured to transfer the workpiece boat between a first position at a time of conveying the workpieces to the workpiece conveyance mechanism and a second position at a time of performing the magnetic annealing processing on the workpieces,
wherein at least one of the cap and the heat insulation portion is provided with an angle adjusting mechanism configured to adjust an angle between a main surface of the cap and a longitudinal axis direction of the heat insulation portion in order to adjust an inclined angle of the workpiece boat, one end of the heat insulation portion being connected to the main surface of the cap and the other end of the heat insulation portion being connected to the workpiece boat.

8. The magnetic annealing apparatus of claim 7, wherein, at the first position, the angle adjusting mechanism adjusts the workpiece boat to be horizontal and, when an angle between a longitudinal axis of the workpiece boat and magnetic force lines within the magnetic field generating unit is deviated from a predetermined angle, at the second position, the angle adjusting mechanism adjusts the inclined angle of the workpiece boat such that the angle between the longitudinal axis of the workpiece boat and the magnetic force lines becomes the predetermined angle.

9. The magnetic annealing apparatus of claim 8, wherein, at the second position, the angle adjusting mechanism adjusts the inclined angle such that the longitudinal axis of the workpiece boat and the magnetic force lines within the magnetic field generating unit become parallel or perpendicular to each other.

10. The magnetic annealing apparatus of claim 7, further comprising:
a push-up mechanism configured to push up a bottom surface of the workpiece boat under the bottom surface at the first position such that the longitudinal axis of the workpiece boat becomes horizontal.

11. The magnetic annealing apparatus of claim 7, wherein the workpieces are wafers and the carrier is a FOUP, and
wherein the FOUP is configured to accommodate 25 sheets of wafers, and the workpiece boat is configured to hold 100 sheets of wafers.

12. The magnetic annealing apparatus of claim 11, wherein the workpiece boat is configured to hold 100 sheets of wafers at predetermined intervals in the longitudinal axis direction of the workpiece boat as the loading direction.

13. The magnetic annealing apparatus of claim 11, wherein the workpiece boat is configured to hold two loading bodies to be parallel to each other in the longitudinal axis of the workpiece boat, each of the two loading bodies being loaded with 50 sheets of wafers at predetermined intervals in a direction perpendicular to the axial direction as a loading direction.

14. A magnetic annealing apparatus comprising:
a carrier conveyance region where a carrier that accommodates one or more workpieces to be processed is conveyed;
a workpiece conveyance region where the workpieces are conveyed; and an opening/closing door interposed between the carrier conveyance region and the workpiece conveyance region, wherein the carrier conveyance region includes:

a first mounting table on which a carrier carried into the magnetic annealing apparatus is disposed;

a plurality of second mounting tables on which the carrier is mounted so as to convey the workpieces from the carrier conveyance region to the workpiece conveyance region through the opening/closing door in a hermetically sealed manner;

a storage unit configured to store a plurality of carriers; and a carrier conveyance mechanism configured to perform carrying-out/carrying-in of the workpieces among the first mounting table, the second mounting tables, and the storage units, wherein the workpiece conveyance region includes:

an aligner device configured to align the workpieces;

a workpiece boat configured to hold the workpieces;

a workpiece conveyance mechanism configured to convey the workpieces among the carrier disposed on the second mounting table, the aligner device, and the workpiece boat;

a heating unit configured to heat the workpieces;

a magnetic field generating unit including a horizontal superconducting magnet configured to apply a magnetic field to the workpieces; and a transfer mechanism connected to the workpiece boat through a connection unit and configured to transfer the workpiece boat between a first position at a time of conveying the workpieces to the workpiece conveyance mechanism and a second position at a time of performing the magnetic annealing processing on the workpieces, and wherein at least one of the cap and the heat insulation portion is provided with an angle adjusting mechanism configured to adjust an angle between a main surface of the cap and a longitudinal axis direction of the heat insulation portion in order to adjust an inclined angle of the workpiece boat, one end of the heat insulation portion being connected to the main surface of the cap and the other end of the heat insulation portion being connected to workpiece boat.

* * * * *